(12) United States Patent
Lee et al.

(10) Patent No.: US 8,652,749 B2
(45) Date of Patent: Feb. 18, 2014

(54) PHOTORESIST COMPOSITION AND METHOD OF FORMING PATTERN BY USING THE SAME

(75) Inventors: Hi-Kuk Lee, Yongin-si (KR); Sang-Hyun Yun, Suwon-si (KR); Cha-Dong Kim, Cheonan-si (KR); Jung-In Park, Suwon-si (KR); Deok-Man Kang, Seongnam-si (KR); Youn-Suk Kim, Yongin-si (KR); Sae-Tae Oh, Pyeongtaek-si (KR)

(73) Assignees: Samsung Display Co., Ltd., Yongin (KR); AZ Electronic Materials (Korea) Ltd., Seoul (KR)

( * ) Notice: Subject to any disclaimer, the term of this patent is extended or adjusted under 35 U.S.C. 154(b) by 164 days.

(21) Appl. No.: 13/037,212

(22) Filed: Feb. 28, 2011

(65) Prior Publication Data

US 2011/0287360 A1     Nov. 24, 2011

(30) Foreign Application Priority Data

May 18, 2010 (KR) .................. 10-2010-0046449

(51) Int. Cl.
*G03F 7/023*      (2006.01)
*G03F 7/30*      (2006.01)

(52) U.S. Cl.
CPC ............ *G03F 7/0236* (2013.01); *G03F 7/30* (2013.01)
USPC ........... 430/192; 430/165; 430/191; 430/193; 430/326

(58) Field of Classification Search
CPC ............................ G03F 7/0236; G03F 7/30
USPC ................. 430/192, 193, 326, 165, 191
See application file for complete search history.

(56) References Cited

U.S. PATENT DOCUMENTS 5,153,096 A * 10/1992 Uenishi et al. ............... 430/192
5,532,107 A * 7/1996 Oie et al. ..................... 430/192
6,265,129 B1 * 7/2001 Takahashi et al. ........... 430/192

* cited by examiner

*Primary Examiner* — John Chu
(74) *Attorney, Agent, or Firm* — H.C. Park & Associates, PLC

(57) ABSTRACT

A photoresist composition is provided. The photoresist composition includes an alkali-soluble resin; a photosensitizer containing a first compound that contains a diazonaphthoquinone represented by Formula 1 and a second compound that contains a diazonaphthoquinone represented by Formula 2; and a solvent.

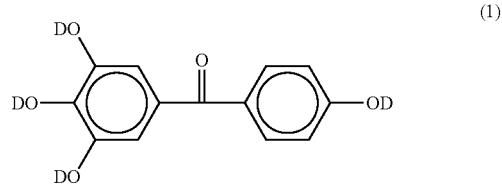

(1)

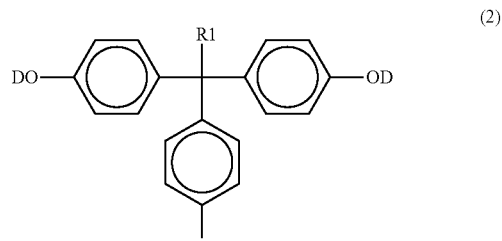

(2)

where 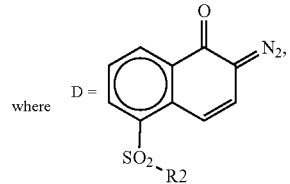

and

R1 is selected from the group consisting of a hydrogen atom, an alkyl group having 1 to 4 carbons, an alkenyl group having 2 to 4 carbons, a cycloalkyl group having 3 to 8 carbons, and an aryl group having 6 to 12 carbons, and R2 is selected from the group consisting of Cl, F, Br, and I.

18 Claims, 13 Drawing Sheets

PHOTORESIST COMPOSITION AND METHOD OF FORMING PATTERN BY USING THE SAME

CROSS REFERENCE TO RELATED APPLICATION

This application claims priority from and the benefit of Korean Patent Application No. 10-2010-0046449, filed on May 18, 2010, which is hereby incorporated by reference for all purposes as if fully set forth herein.

BACKGROUND OF THE INVENTION

1. Field of the Invention

Exemplary embodiments of the present invention relate to a photoresist composition and a method of forming a pattern by using the photoresist composition, and more particularly, to a photoresist composition that may be used to form a photoresist pattern having a high profile angle and a method of forming a pattern by using the photoresist composition.

2. Discussion of the Background

In a process of manufacturing printed circuit boards, semiconductor wafers, and substrates of liquid crystal display (LCD) panels, a complicated circuit pattern is typically formed on a top surface of a base substrate such as an insulating substrate or a glass substrate. To form the circuit pattern, a photolithography technique is widely used.

According to the photolithography technique, a photoresist film is formed on a base substrate and is exposed to light by using a photomask that has a mask pattern that corresponds to a circuit pattern. Photomasks are manufactured with high precision and are very expensive. Thus, research is being conducted on a method of exposing a photoresist film to light by using a reduced number of photomasks or without using photomasks through process improvement.

As an example of an exposure method for photoresist films that does not use photomasks, a digital exposure method in which an exposure beam of light is digitally controlled to be turned on or off for each pixel of a mask pattern is receiving attention. In the digital exposure method, millions of micromirrors of a spatial light modulator are instantaneously driven to selectively reflect light emitted from a light source. Accordingly, light is spatially modulated and controlled to form a pattern on a substrate.

The digital exposure method may use light from an H-line laser diode instead of a conventional high-pressure mercury lamp in order to prevent the deterioration of digital micromirrors, which are typically aluminum. H-line light may have a wavelength of approximately 405 nm. To form a pattern having a high profile angle, i.e., an angle of the walls of the patterned structure that are nearly normal to the supporting structure, using the digital exposure method, a photoresist composition with high sensitivity to the H-line light should be developed.

SUMMARY OF THE INVENTION

Exemplary embodiments of the present invention provide a photoresist composition that may be used to form a photoresist pattern having a high profile angle.

Exemplary embodiments of the present invention also provide a method of forming a pattern by using a photoresist composition to form a photoresist pattern having a high profile angle.

Additional features of the invention will be set forth in the description which follows, and in part will be apparent from the description, or may be learned by practice of the invention.

An exemplary embodiment of the present invention discloses a photoresist composition that comprises an alkali-soluble resin; a photosensitizer comprising a first compound comprising a diazonaphthoquinone represented by Formula 1 and a second compound comprising a diazonaphthoquinone represented by Formula 2; and a solvent. Formula 1 and Formula 2 are respectively:

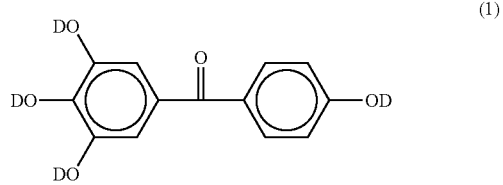

(1)

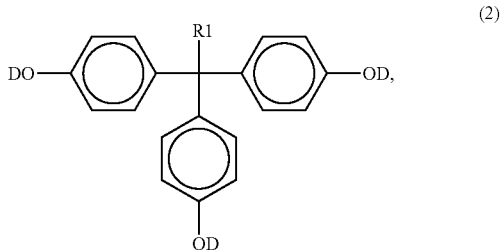

(2)

wherein 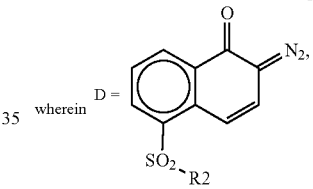

and
R1 is selected from the group consisting of a hydrogen atom, an alkyl group having 1 to 4 carbons, an alkenyl group having 2 to 4 carbons, a cycloalkyl group having 3 to 8 carbons, and an aryl group having 6 to 12 carbons, and R2 is selected from the group consisting of Cl, F, Br, and I.

An exemplary embodiment of the present invention also discloses a method of forming a pattern that comprises forming a photoresist film by coating a pattern forming film comprising a photoresist composition comprising an alkali-soluble resin, a photosensitizer comprising a first compound comprising a diazonaphthoquinone represented by Formula 1 and a second compound comprising a diazonaphthoquinone represented by Formula 2, and a solvent; exposing the photoresist film to light; forming a photoresist pattern by developing the photoresist film; and patterning the pattern forming film by using the photoresist pattern as an etch mask. Formula 1 and Formula 2 are respectively:

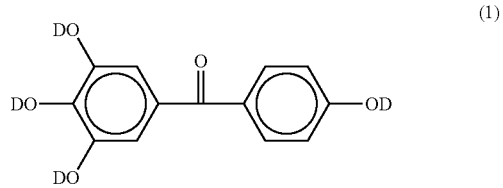

(1)

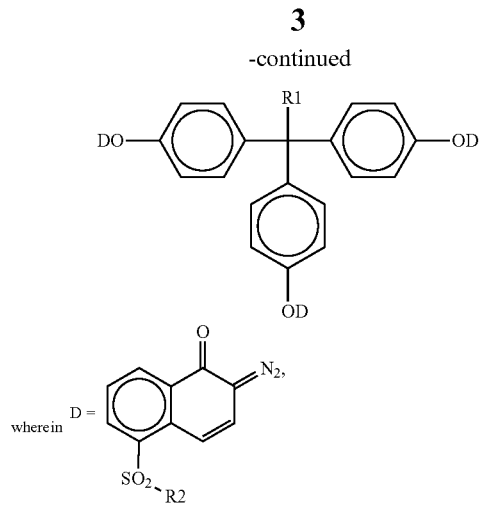

and

R1 is selected from the group consisting of a hydrogen atom, an alkyl group having 1 to 4 carbons, an alkenyl group having 2 to 4 carbons, a cycloalkyl group having 3 to 8 carbons, and an aryl group having 6 to 12 carbons, and R2 is selected from the group consisting of Cl, F, Br, and I It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
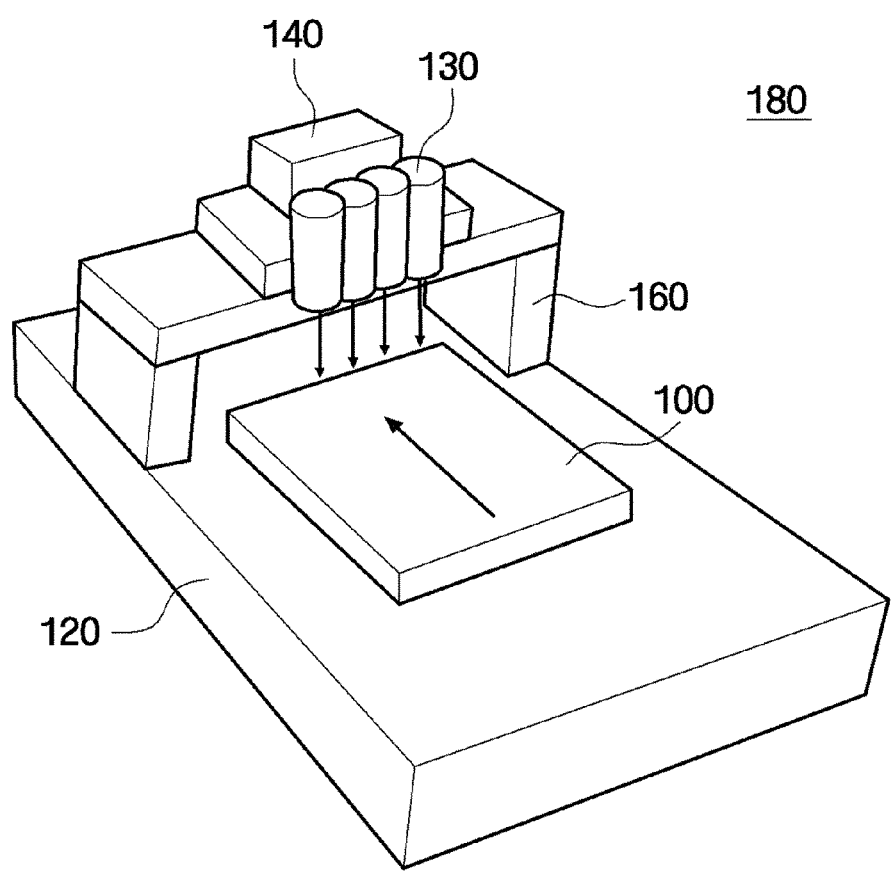
FIG. 1 is a perspective view of a digital exposure apparatus used to form a pattern according to an exemplary embodiment of the present invention.

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

As used herein, the singular forms "a", "an" and "the" are intended to include the plural forms as well, unless the context clearly indicates otherwise. It will be further understood that the terms "comprises" and/or "made of," when used in this specification, specify the presence of stated components, steps, operations, and/or elements, but do not preclude the presence or addition of one or more other components, steps, operations, elements, and/or groups thereof.

It will be understood that when an element or layer is referred to as being "on," "connected to," or "coupled to" another element or layer, it can be directly on, directly connected to, directly coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as shown in the figures. It will be understood that the spatially relative terms are intended to encompass different orientations of the device in use or operation, in addition to the orientation depicted in the figures. Throughout the specification, like reference numerals in the drawings denote like elements.

Hereinafter, a photoresist composition according to an exemplary embodiment of the present invention will be described in detail.

Photoresist Composition

A photoresist composition according to an exemplary embodiment of the present invention includes an alkali-soluble resin, a photosensitizer containing a first compound that contains a diazonaphthoquinone represented by Formula 1 below and a second-compound which contains a diazonaphthoquinone represented by Formula 2 below, and a solvent.

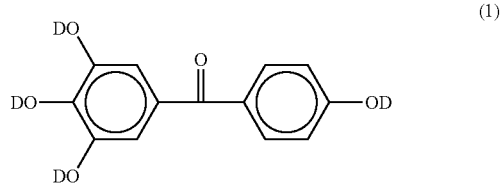

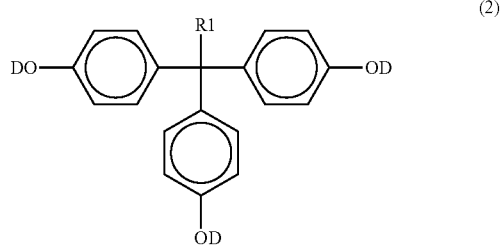

where D has the following structure:

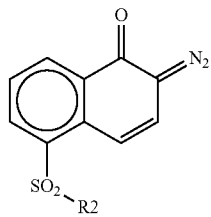

and where R1 is selected from the group consisting of a hydrogen atom, an alkyl group having 1 to 4 carbons, an alkenyl group having 2 to 4 carbons, a cycloalkyl group having 3 to 8 carbons, and an aryl group having 6 to 12 carbons, and R2 is selected from the group consisting of Cl, F, Br, and I.

The alkali-soluble resin is soluble in an alkaline solution such as an aqueous alkaline developing solution but is insoluble in water. The alkali-soluble resin is not limited to a particular resin and may be any resin well known in the art to which the present invention pertains. For example, the alkali-soluble resin may be a novolac resin. The novolac resin may be obtained by the addition-condensation reaction of a phenolic compound with an aldehyde compound.

Examples of the phenolic compound used to prepare the novolac resin may include phenol, o-cresol, m-cresol, p-cresol, 2,5-xylenol, 3,5-xylenol, 3,4-xylenol, 2,3,5-trimethylphenol, 4-t-butylphenol, 2-t-butylphenol, 3-t-butylphenol, 3-ethylphenol, 2-ethylphenol, 4-ethylphenol, 3-methyl-6-t-butylephenol, 4-methyl-2-t-butylphenol, 2-naphthol, 1,3-dihydroxynaphthalene, 1,7-dihydroxynaphthalene, and 1,5-dihydroxynaphthalene. These may be used alone or in a mixture combining two or more of them. In some embodiments, a cresol monomer in which m-cresol and p-cresol are mixed in a 1:1 ratio may be used as the phenolic compound.

Examples of the aldehyde compound used to prepare the novolac resin may include formaldehyde, paraformaldehyde, acetaldehyde, propyl aldehyde, benzaldehyde, phenylaldehyde, α-phenyl propyl aldehyde, β-phenyl propyl aldehyde, o-hydroxybenzaldehyde, m-hydroxybenzaldehyde, p-hydroxybenzaldehyde, glutaraldehyde, glyoxal, and o-methylbenzaldehyde, and p-methylbenzaldehyde. These may be used alone or in a mixture of two or more of them.

The addition-condensation reaction of the phenol compound with the aldehyde compound in preparing the novolac resin may be performed using a conventional method in the is presence of an acid catalyst. Here, the reaction temperature range may be from approximately 60° C. to 250° C., and the reaction time may be range from approximately 2 hours to 30 hours. Examples of the acid catalyst include organic acids such as oxalic acid, formic acid, trichloroacetic acid, and p-toluenesulfonic acid; inorganic acids such as hydrochloric acid, sulfuric acid, perchloric acid, and phosphoric acid; and divalent metal salts such as zinc acetate and magnesium acetate. In some embodiments, a cresol novolac resin may be prepared by the condensation reaction of a cresol monomer with formaldehyde in the presence of oxalic acid as a catalyst.

The addition-condensation reaction of the phenol compound with the aldehyde compound in preparing the novolac resin may be performed in an appropriate solvent or neat. The novolac resin prepared by the addition-condensation reaction may have a weight-average molecular weight of about 2,000 to about 50,000 in terms of monodisperse polystyrene as measured, e.g., by gel permeation chromatography (GPC).

When the weight-average molecular weight of the novolac resin is less than about 2,000, a film-remaining rate may be too low after development. Further, the novolac resin may have a heat resistance that is too small, causing significant melting of a pattern during hard baking. On the other hand, when the weight-average molecular weight of the novolac resin is greater than about 50,000, residues may be created after development, and peel characteristics may deteriorate. Thus, it may be difficult to use the novolac resin of with a weight-average molecular weight of less than about 2,000 or greater than about 50,000.

The alkali-soluble resin may be added in a range from about 2 parts by weight to about 50 parts by weight, preferably about 5 parts by weight to about 20 parts by weight, based on 100 parts by weight of the photoresist composition. When the alkali-soluble resin is added at is less than about 2 parts by weight or greater than about 50 parts by weight, it may be difficult to coat a substrate with the photoresist composition to a desired thickness due to a resin content being too low or too high.

The photosensitizer may include the first compound containing a diazonaphthoquinone as in Formula 1 and the second compound containing a diazonaphthoquinone as in Formula 2.

More specifically, the first compound represented by Formula 1 may be obtained by the condensation reaction of 2,3,4,4'-tetrahydroxybenzophenone with a naphthoquinone 1,2-diazide-5-sulfonyl chloride compound.

The second compound represented by Formula 2 may be obtained by the condensation reaction of 4,4',4''-ethylidynetrisphenol with a naphthoquinone 1,2-diazide-5-sulfonyl chloride compound. The second compound may be added in a range from about 10 parts by weight to about 20 parts by weight based on 100 parts by weight of the photoresist composition. When the second compound is added at less than about 10 parts by weight, the film-remaining rate is too high. Therefore, a pattern may not be properly formed after development. On the other hand, when the second compound is added at greater than about 20 parts by weight, it may not be properly developed, thus leaving too many residues.

The photosensitizer may be added in a range from about 1 part by weight to about 25 parts by weight, preferably about 2 parts by weight to about 10 parts by weight, based on 100 parts by weight of the photoresist composition. When added at less than about 1 part by weight, the photosensitizer may lose photosensitivity, thereby making it difficult to form a pattern. On the other hand, when added at greater than about 25 parts by weight, the photosensitizer may rapidly deteriorate the storage stability of products.

In the photosensitizer, the first compound represented by Formula 1 and the second compound represented by Formula 2 may be mixed in a ratio ranging from about 1:9 to about 5:5. When the content of the second compound is smaller than that of the first compound, resolution and pattern angle may noticeably deteriorate. When a ratio of the content of the second compound to the content of the first compound is greater than about 9, a shape of the pattern may be T-top shaped in which an upper part of a pattern is larger than a lower part thereof. In some embodiments, the first compound represented by Formula 1 and the second compound represented by Formula 2 may be mixed in a ratio ranging from about 1:3 to about 1:7. When the content of the first compound represented by Formula 1 is too low or too high, the profile shape may be too high or too low.

The solvent may be any solvent that can dissolve and solvate the alkali-soluble resin and the first and second compounds containing diazonaphthoquinones. In particular, a solvent that evaporates at an appropriate drying rate to form a uniform and flat photoresist film may be used.

Examples of the solvent include glycol ether esters such as 2-ethoxyethanol acetate, 2-methoxyethanol acetate, propylene glycol monomethyl ether acetate, and propylene glycol monoethyl ether acetate; glycol ethers such as 2-ethoxyethanol, 2-methoxyethanol, propylene glycol monomethyl ether, and propylene glycol monoethyl ether; esters such as ethyl acetate, butyl acetate, amyl acetate, and ethyl pyruvate; ketones such as acetone, methyl isobutyl ketone, and 2-heptene and cyclohexanone; and cyclic esters such as γ-butyrolactone. These solvents may be used alone or in a mixture of two or more thereof.

When necessary, the photoresist composition according to the current exemplary embodiment may also include a surfactant, an adhesion promoter, a plasticizer, a sensitizer, and other resin components.

The surfactant may be added to enhance the coating and developing characteristics of the photoresist composition. Examples of the surfactant include polyoxyethylene octyl phenyl ether, polyoxyethylene nonyl phenyl ether, F171, F172 and F173 (product names of Dainippon Ink and Chemicals Ltd.), FC430 and FC431 (product names of Sumitomo 3M Ltd.), and KP341 (a product name of Shin-Etsu Chemical Co., Ltd).

The adhesion promoter may be added to increase the adhesion of a photoresist pattern to a substrate. For example, a silane coupling agent having a reactive substituent, such as a carboxyl group, a methacryl group, an isocyanate group, or an epoxy group, may be used as the adhesion promoter. Specific examples of the adhesion promoter include γ-methacryloxypropyltrimethoxysilane, vinyltriacetoxysilane, vinyltrimethoxysilane, γ-isocyanate propyl triethoxysilane, γ-glycidoxypropyltrimethoxysilane, and β-(3,4-epoxycyclohexyl) ethyltrimethoxysilane. These adhesion promoters may be used alone or in a mixture of two or more thereof.

Hereinafter, a method of forming a pattern according to an exemplary embodiment of the present invention will be described in detail with reference to the drawings.

Method of Forming a Pattern

Figure 2:
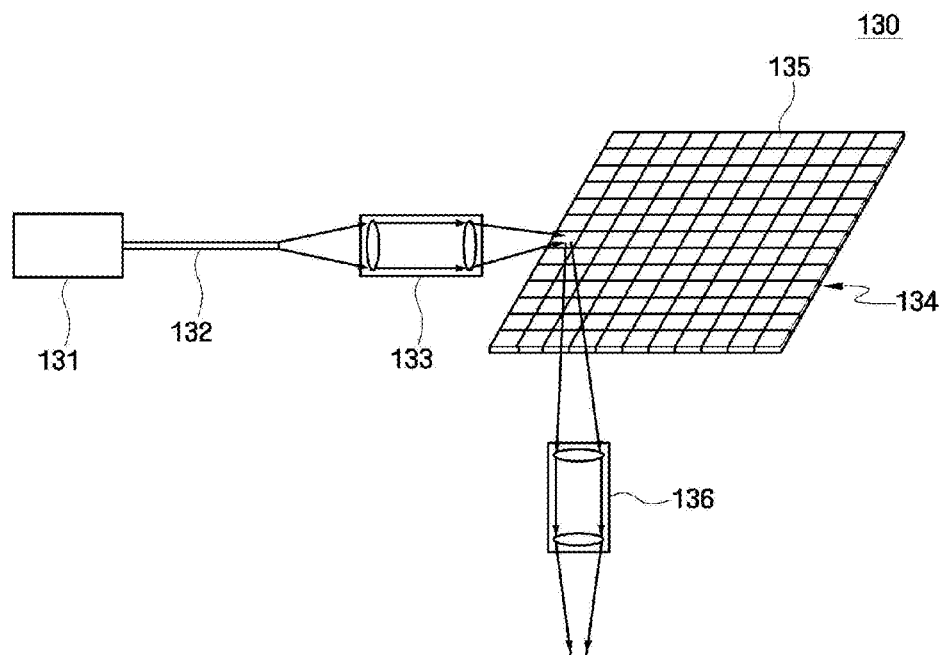
FIG. 2 is a diagram showing an exposure head from FIG. 1.

The structure of a digital exposure apparatus used to form a pattern according to an exemplary embodiment of the present invention is now described with reference to FIG. 1 and FIG. 2. FIG. 1 is a perspective view of a digital exposure apparatus 180 used in a method of forming a pattern by using a photoresist composition according to an exemplary embodiment of the present invention. FIG. 2 is a diagram showing an exposure head 130 from FIG. 1.

Referring to FIG. 1 and FIG. 2, the digital exposure apparatus 180 includes a stage 120 to transport a substrate 100, exposure heads 130 to supply light to the substrate 100, a first support 140 supporting the exposure heads 130, and second supports 160 maintaining a gap between the substrate 100 and the exposure heads 130.

The stage 120 transports the substrate 100 on which a pattern is to be formed to pass under the exposure heads 130. Here, the stage 120 may transport the substrate 100 at an appropriate speed to allow a photoresist on the substrate 100 to be exposed to light provided by the exposure heads 130.

The first support 140 fixes the exposure heads 130. The first support 140 may include a connecting device that provides pattern data received from an external source to the exposure heads 130. The first support 140 is mounted on the second supports 160. The second supports 160 extend from the stage 120 to allow the substrate 100 to pass under the exposure heads 130.

Exposure heads 130 supply light to a location on a surface based on pattern data. To this end, each exposure head 130 may include a digital micromirror device (DMD) 134 shown in FIG. 2.

The DMD 134 includes a controller that includes a data processor and a mirror driving controller. The data processor of the controller generates, based on input of pattern data, a control signal for driving and controlling each micromirror 135 located in a region of the DMD 134 for each exposure head 130. In addition, the mirror driving controller controls the angle of the reflective surface of each micromirror 135 in the DMD 134 of each exposure head 130 based on a control signal generated by an image data processor.

The DMD 134 may also include at least one laser diode 131 to generate light and at least one fiber optic 132 providing light generated by the laser diode 131 to the DMD 134. The laser diode 131 may be formed outside each of the exposure heads 130. In this case, the optic fiber 132 may supply light generated by the external laser diode to a corresponding one of the exposure heads 130.

A first lens system 133 is formed on a light incident side of the DMD 134. The first lens system 133 concentrates light received from the laser diode 131 via the fiber optic 132 and provides the concentrated light to the DMD 134. The first lens system 133 includes a plurality of lenses that collimates light output from an end of the optic fiber 132 and corrects the collimated light for a uniform intensity distribution. The first lens system 133 may also include a condensing lens which concentrates the corrected light onto the DMD 134.

The DMD 134 includes a plurality of micromirrors 135 arranged in a lattice form. Each micromirror 135 may move at an angle, e.g., ±10 degrees, with respect to the substrate 100. A material such as aluminum having high reflectivity is deposited on a surface of each micromirror 135. The reflectivity of each micromirror 135 may be at least 90%. The angle of reflection of the micromirrors 135 may be controlled based on pattern data so that light input to the DMD 134 may be reflected in a direction in which each of the micromirrors 135 slopes.

A second lens system 136 is disposed on the light reflecting side of the DMD 134 to form an image of light reflected by the DMD 134 on the substrate 100. The second lens system 136 is formed between the DMD 134 and the substrate 100 to concentrate light reflected by the DMD 134 onto the substrate 100.

Without using a mask as described above, the digital exposure apparatus 180 may expose a region of a photoresist film formed on the substrate 100 to light by using exposure heads 130.

A method of forming a pattern according to an exemplary embodiment of the present invention is described with reference to FIG. 3, FIG. 4, FIG. 5, and FIG. 6. FIG. 3, FIG. 4, FIG. 5, and FIG. 6 are cross-sectional views of a method of forming a pattern according to an exemplary embodiment of the present invention.

Figure 3:
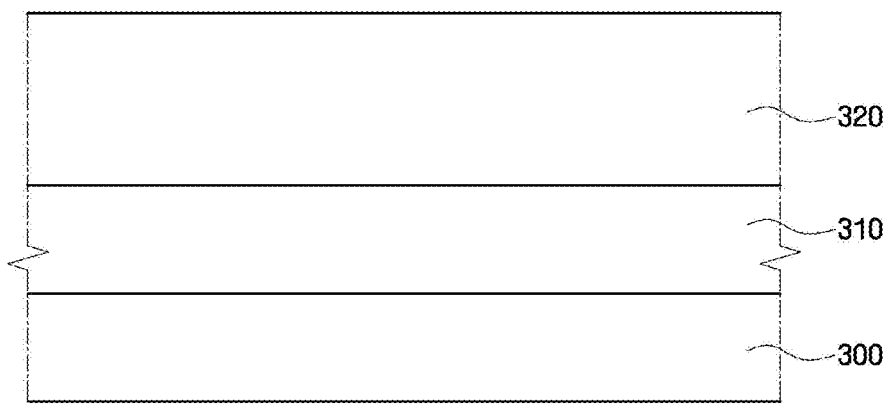
FIG. 3, FIG. 4, FIG. 5, and FIG. 6 are cross-sectional views of a method of forming a pattern according to an exemplary embodiment of the present invention.

Referring to FIG. 3, a substrate 300 is prepared, and a pattern forming film 310 is formed thereon. A cleaning process for removing moisture or contaminants from a surface of the pattern forming film 310 or the substrate 300 may be performed.

The pattern forming film 310 is coated with a photoresist composition which includes an alkali-soluble resin, a photosensitizer containing a first compound containing a diazonaphthoquinone represented by Formula 1 and a second compound containing a diazonaphthoquinone represented by Formula 2, and a solvent, thereby forming a photoresist film 320. The pattern forming film 310 may be coated with the photoresist composition by using a spray method, a roll-coating method, or a spin-coating method. The photoresist composition is substantially similar to the photoresist composition according to the above-described embodiment of the present invention so repeated description is omitted.

After the photoresist film 320 is formed, the substrate 300 may be heated in a first baking process. For example, the first baking process may be performed in a range from approximately 70° C. to 130° C. The first baking process may remove the solvent and increase the adhesion between the pattern forming film 310 and the photoresist film 320.

Figure 4:
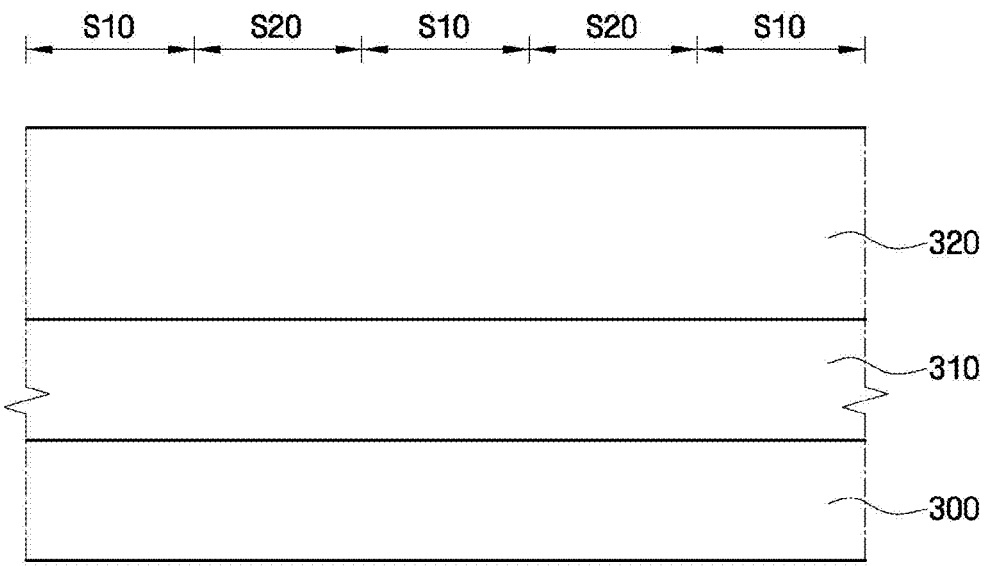

Referring to FIG. 4, the substrate 300 is exposed to light. Specifically, the substrate 300 is placed on the stage 120 of the digital exposure apparatus 180 shown in FIG. 1 and is exposed to light for a period of time. Here, the exposure heads 130 irradiate light to regions S10 in which no pattern is to be formed and do not irradiate light to regions S20 in which a pattern is to be formed. The structure of the photoresist composition in the regions S10 of the photoresist film 320, which are exposed to light, is changed such that the photoresist composition can be dissolved in a developing solution. Light irradiated by the digital exposure apparatus 180 may be H-line light having a wavelength of approximately 405 nm.

Figure 5:
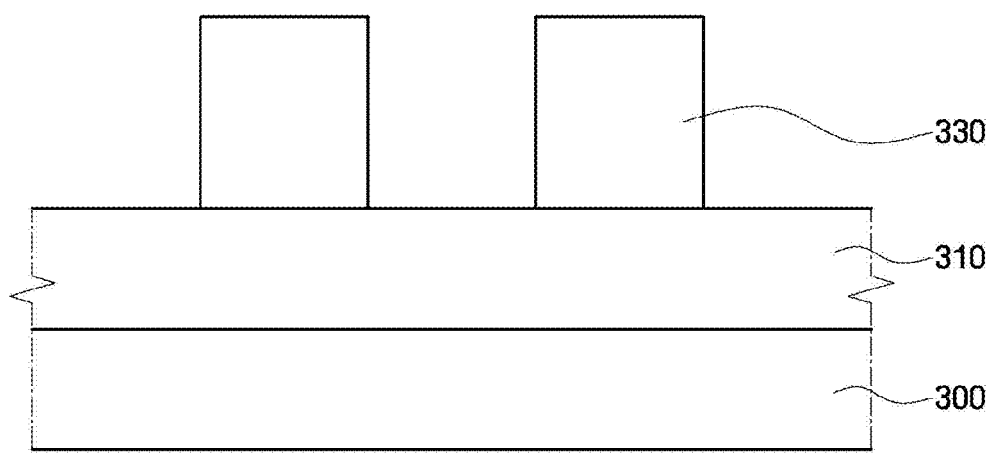

Referring to FIG. 5, the exposed regions S10 of the photoresist film 320 are removed using a developing solution, thereby forming a photoresist pattern 330. Since the photoresist composition according to the current exemplary embodiment is a positive photoresist composition, the photoresist composition in the exposed regions S10 of the photoresist film 320 is removed. The developing solution may be one of conventional developing solutions, for example, a tetramethylammonium hydroxide (TMAH) solution.

A second baking process may be performed on the developed photoresist pattern 330.

Figure 6:
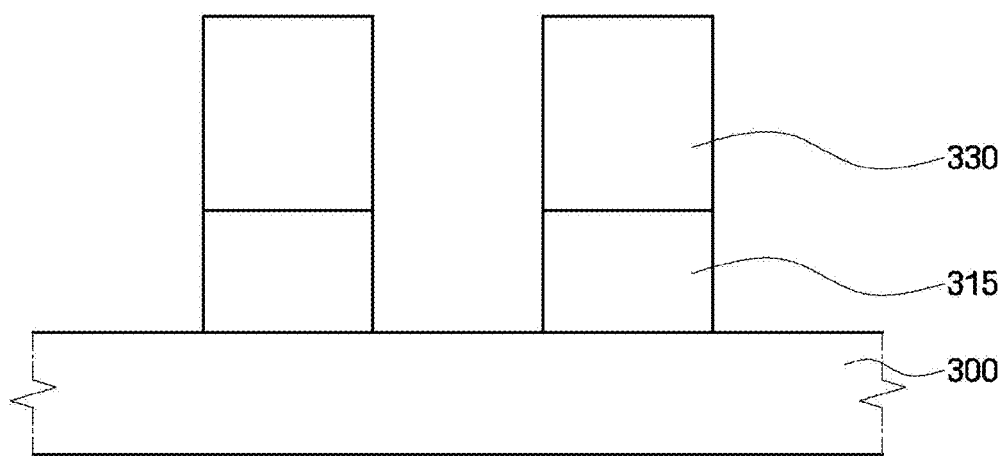

Next, referring to FIG. 6, the pattern forming film 310 under the photoresist pattern 330 is etched using the photoresist pattern 330 as an etch mask, thereby forming a pattern 315.

Hereinafter, a method of manufacturing a display device according to an exemplary embodiment of the present invention is described with reference to the drawings.

Method of Manufacturing a Display Device

Figure 7:
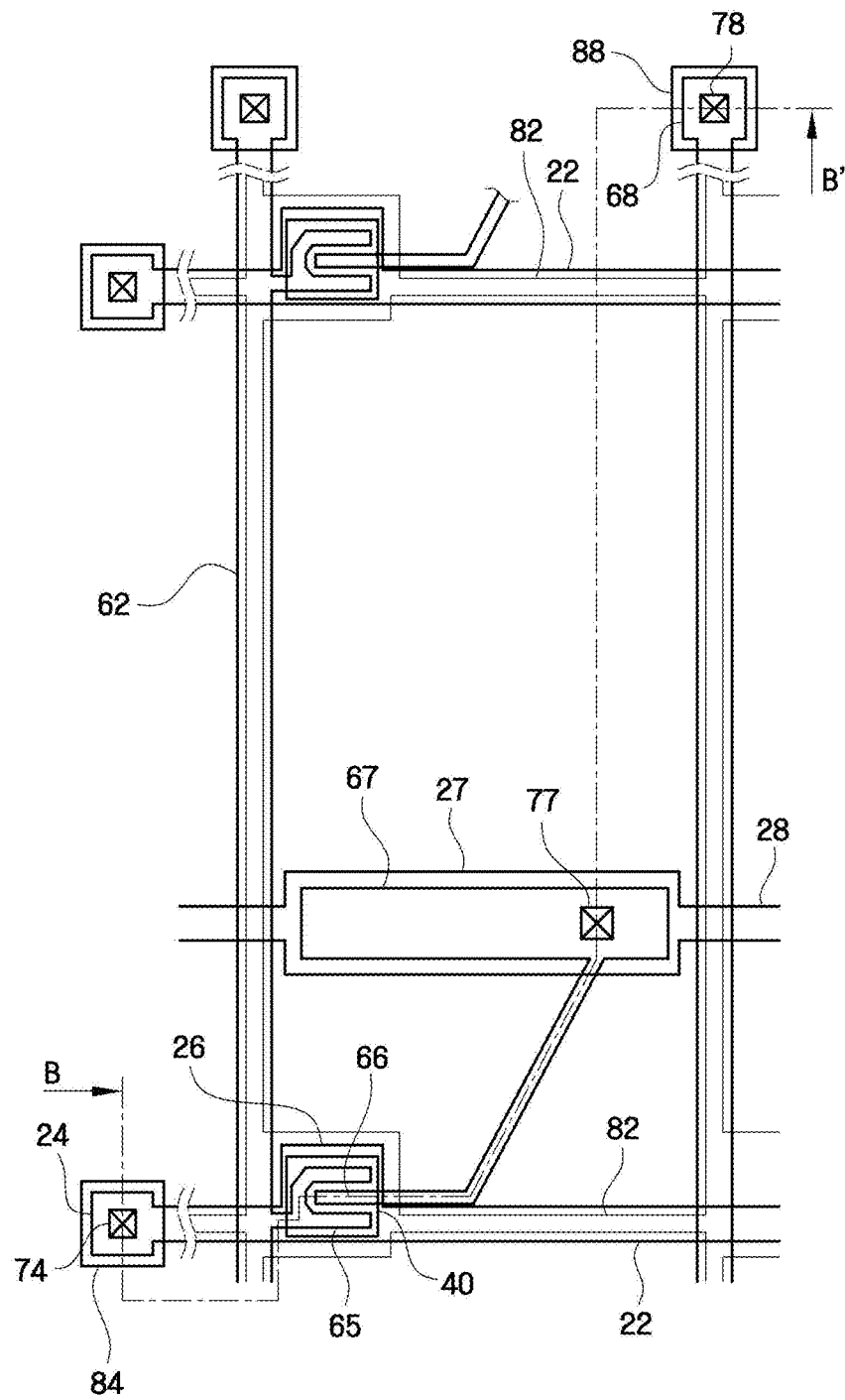
FIG. 7 is a layout view of a thin-film transistor (TFT) substrate manufactured using a manufacturing method according to an exemplary embodiment of the present invention.
Figure 8:
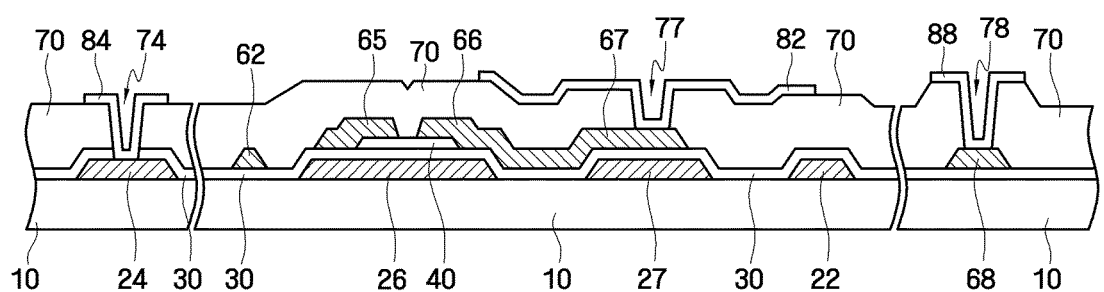
FIG. 8, FIG. 9A, FIG. 9B, FIG. 10A, FIG. 10B, FIG. 11, FIG. 12, FIG. 13A, and FIG. 13B show a method of manufacturing the display device shown in FIG. 7.

First, the structure of a thin-film transistor (TFT) substrate manufactured using a method according to an exemplary embodiment of the present invention is described with reference to FIG. 7 and FIG. 8. FIG. 7 is a layout view of a TFT substrate manufactured using a manufacturing method according to an exemplary embodiment of the present invention. FIG. 8 is a cross-sectional view of the TFT substrate taken along line B-B' of FIG. 7.

Referring to FIG. 7 and FIG. 8, a plurality of gate wirings, which deliver gate signals, are formed on an insulating substrate 10. The gate wiring includes a gate line 22, a gate end 24, a gate electrode 26, a sustain electrode 27, and a sustain electrode line 28. The gate line 22 extends horizontally, and the gate end 24 is connected to an end of the gate line 22 and delivers a gate signal, which is received from an external source, to the gate line 22. The gate electrode 26 of a TFT is connected to the gate line 22 and protrudes from the gate line 22. The sustain electrode 28 is parallel to the gate line 22, and the sustain electrode line 28 extends horizontally across a pixel region. The sustain electrode 27, which is wider than the sustain electrode line 28, is connected to the sustain electrode line 28.

The sustain electrode 27 is overlapped by a drain electrode extension portion 67 connected to a pixel electrode 82, which will be described later, to form a storage capacitor that improves the charge storage of a pixel. The shapes and dispositions of the sustain electrode 27 and the sustain electrode line 28 may vary. If sufficient sustain capacitance can be generated by overlapping the pixel electrode 82 and the gate line 22, the sustain electrode 27 and the sustain electrode line 28 may not be formed.

The gate wiring, i.e., the gate line 22, the gate end 24, the gate electrode 26, and the sustain electrode 27, may be made of an aluminum (Al)-based metal such as Al and an Al alloy, a silver (Ag)-based metal such as Ag and a Ag alloy, a copper (Cu)-based metal such as Cu and a Cu alloy, a molybdenum (Mo)-based metal such as Mo and a Mo alloy, chromium (Cr), titanium (Ti), or tantalum (Ta).

In addition, the gate wiring may have a multi-film structure composed of two conductive films (not shown) with different physical characteristics. One of the two conductive films may be made of a metal with low resistivity such as an Al-based metal, an Ag-based metal, or a Cu-based metal, to reduce a signal delay or a voltage drop of the gate wiring. The other is conductive film may be made of a different material, in particular, a material having superior contact characteristics with indium tin oxide (ITO) and indium zinc oxide (IZO) such as a Mo-based metal, Cr, Ti, or Ta. Examples of multi-film structures include a Cr-containing lower film and an Al-containing upper film and an Al-containing lower film and a Mo-containing upper film. However, the present invention is not limited thereto. The gate wiring may be made of various metals and conductors.

The sustain electrode line 28 may have a structure and composition similar to the gate wiring.

A gate insulating film 30, which may contain silicon nitride (SiNx), is disposed on the gate wiring, i.e., the gate line 22, the gate end 24, the gate electrode 26, the sustain electrode 27, and the sustain electrode line 28.

A semiconductor layer 40, which may be formed of a semiconductor such as hydrogenated amorphous silicon or polycrystalline silicon, is disposed on the gate insulating film 30. The semiconductor layer 40 may have various shapes. For example, the semiconductor layer 40 may be an island or may be formed to be linear.

Data wiring is formed on the semiconductor layer 40 and the gate insulating film 30. The data wiring includes a data line 62, a source electrode 65, a data end 68, a drain electrode 66, and the drain electrode extension portion 67. The data line 62 extends vertically and intersects the gate line 22 defining a pixel. The source electrode 65 branches from the data line 62 and extends onto the semiconductor layer 40. The data end 68 is connected to an end of the data line 62 and receives an image signal from an external source. The drain electrode 66 is separated from the source electrode 65 and is formed on the semiconductor layer 40 to face the source electrode 65 with respect to the gate electrode 26. The drain electrode extension portion 67; which may have a relatively large area, extends from the drain electrode 66 and overlaps the sustain electrode 27.

The data wiring, i.e., the data line 62, the source electrode 65, the drain electrode 66, the data electrode extension portion 67, and the data end 68, may be made of Cr, a Mo-based metal, or a refractory metal such as Ta and Ti. In addition, the data wiring may have a multi-film structure composed of a lower film (not shown) that may contain a refractory metal and an upper film (not shown) that may contain a material with low resistivity and may be disposed on the lower film. Examples of multi-film structures include a Cr lower film and an Al upper film and an Al lower film and a Mo upper film. Alternatively, the multi-film structure may be a three-film structure having Mo—Al—Mo films.

The source electrode 65 overlaps at least part of the semiconductor layer 40. In addition, the drain electrode 66 faces the source electrode 65 with respect to the gate electrode 26 and overlaps at least part of the semiconductor layer 40.

The drain electrode extension portion 67 overlaps the sustain electrode 27 forming a sustain capacitor with the gate insulating film 30 interposed therebetween. When the storage electrode 27 is not formed, the drain electrode extension portion 67 may not be formed.

A passivation film 70 may be formed on the data wiring and an exposed portion of the semiconductor layer 40. The passivation film 70 may be made of an organic material having photosensitivity and superior planarization properties, a low-k insulating material that may be formed by plasma enhanced chemical vapor deposition (PECVD), such as a-Si:C:O or a-Si:O:F, or an inorganic material such as SiNx. When the passivation film 70 is made of an organic material, an insulating film (not shown) made of SiNx or SiO2 may additionally be disposed under the organic film in order to prevent contact between the organic material of the passivation film 70 and the exposed portion of the semiconductor layer 40 between the source electrode 65 and the drain electrode 66.

Contact holes 77 and 78 are formed in the passivation film 70, respectively, to expose the drain electrode extension portion 67 and the data end 68. Further, a contact hole 74 is formed in the passivation film 70 and the gate insulating film 30 to expose the gate end 24. The pixel electrode 82 is formed on the passivation film 70. The pixel electrode 82 is electrically connected to the drain electrode 66 by the contact hole 77 and is located in a pixel. When a data voltage is applied to the pixel electrode 82, the pixel electrode 82 generates an electric field together with a common electrode of an upper display substrate, thereby determining the alignment of liquid crystal molecules of a liquid crystal layer interposed between the pixel electrode 82 and the common electrode to determine light transmission through the liquid crystal layer.

An auxiliary gate end 84 and an auxiliary data end 88 are formed on the passivation film 70 and are connected to the gate end 24 and the data end 68 by the contact holes 74 and 78, respectively. The pixel electrode 82, the auxiliary gate end 86, and the auxiliary data end 88 may be made of a transparent conductor such as ITO or IZO.

Hereinafter, a method of manufacturing a display device according to an exemplary embodiment of the present invention is described with reference to FIG. 7, FIG. 8, FIG. 9A, FIG. 9B, FIG. 10A, FIG. 10B, FIG. 11, FIG. 12, FIG. 13A, and FIG. 13B. FIG. 9A, FIG. 9B, FIG. 10A, FIG. 10B, FIG. 11, FIG. 12, FIG. 13A, and FIG. 13B show a method of manufacturing the display device shown in FIG. 7.

Figure 9A:
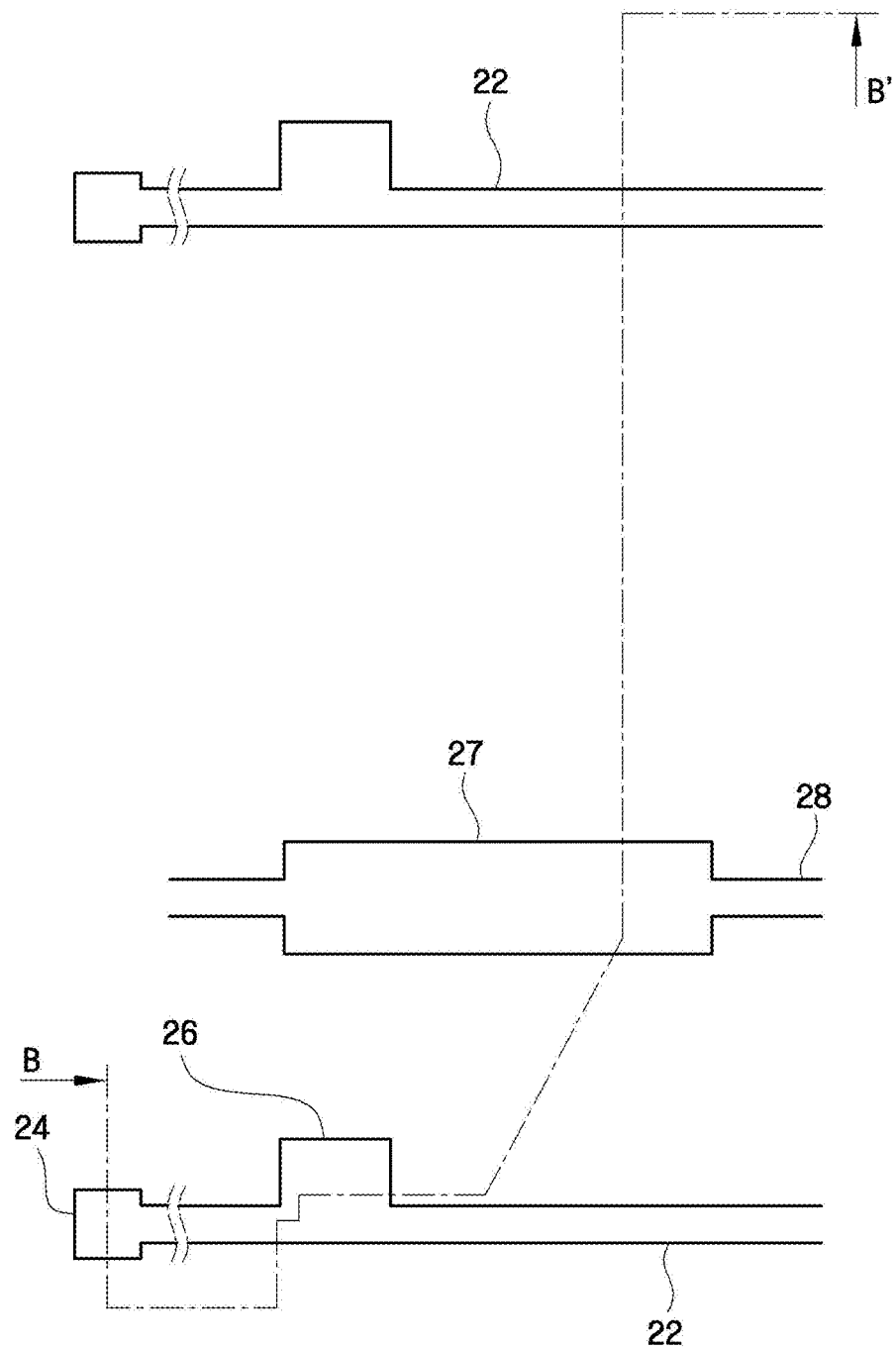
Figure 9B:
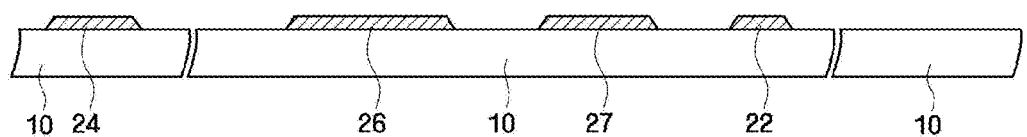

Referring to FIG. 9A and FIG. 9B, the gate wiring, i.e., the gate line 22, the gate end 24, the gate electrode 26, the sustain electrode 27, and the sustain electrode line 28, are formed on the substrate 10. Specifically, a gate wiring conductive film may be formed using, e.g., sputtering. To form the gate wiring from patterning the gate wiring conductive film, wet etching or dry etching may be used. For wet etching, phosphoric acid, nitric acid, or acetic acid may be used as an etching solution. For dry etching, a chlorine (Cl)-based etching gas such as $Cl_2$ or $BCl_3$, may be used.

Figure 10A:
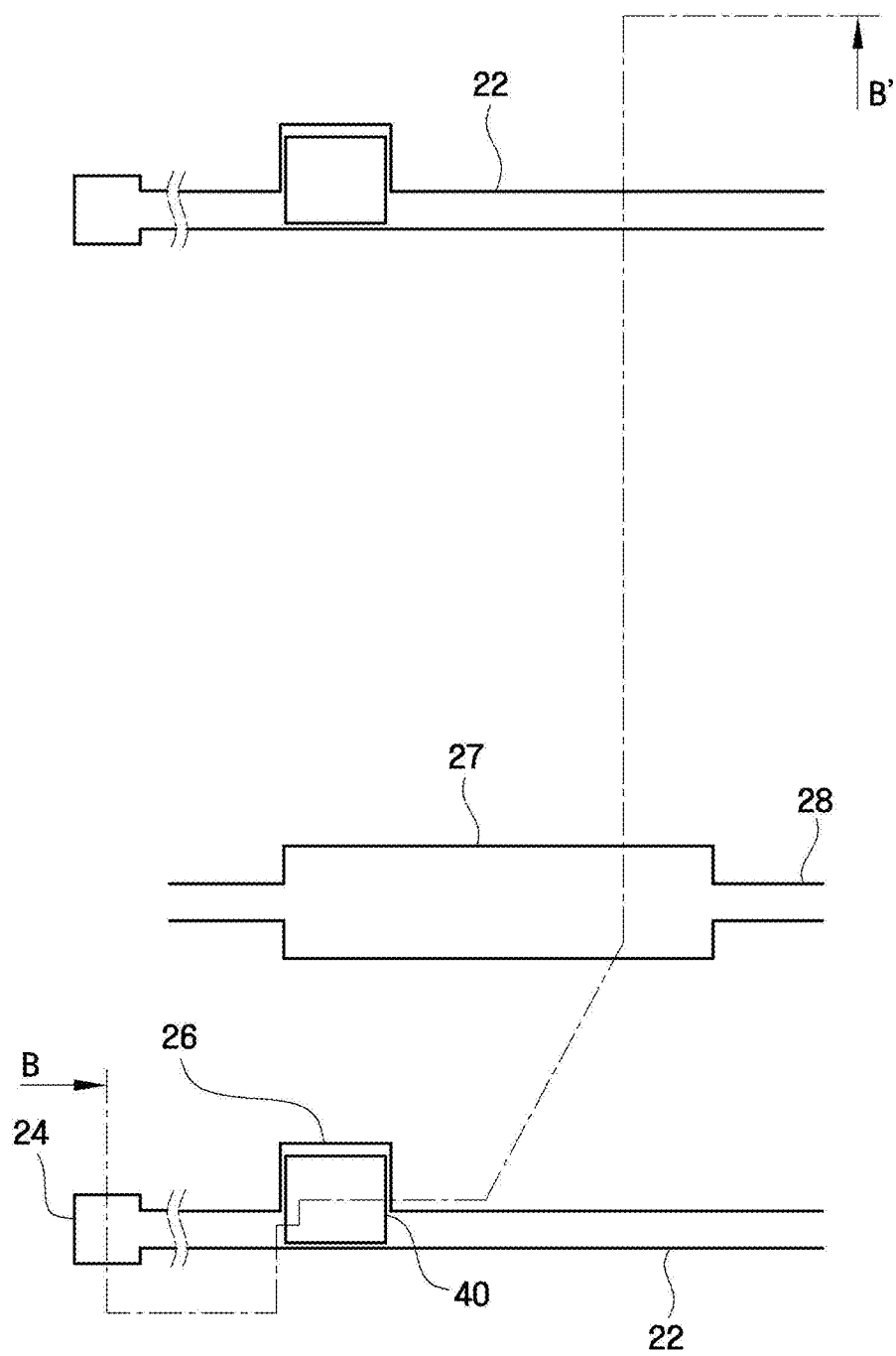
Figure 10B:
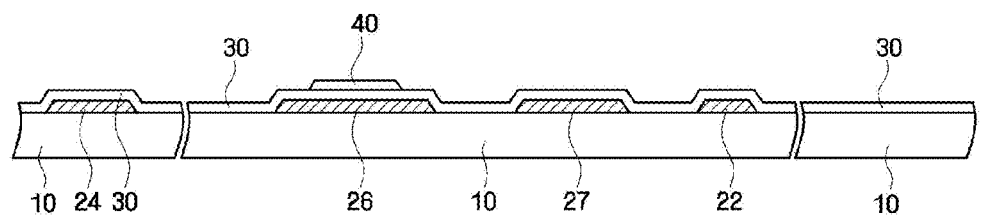

Next, referring to FIG. 10A and FIG. 10B, the gate insulating film 30, which may be formed of SiNx, is formed on the substrate 10 and the gate wiring by using, e.g., PECVD, or reactive sputtering. Then, the semiconductor layer 40 is formed on the gate insulating film 30.

Figure 11:
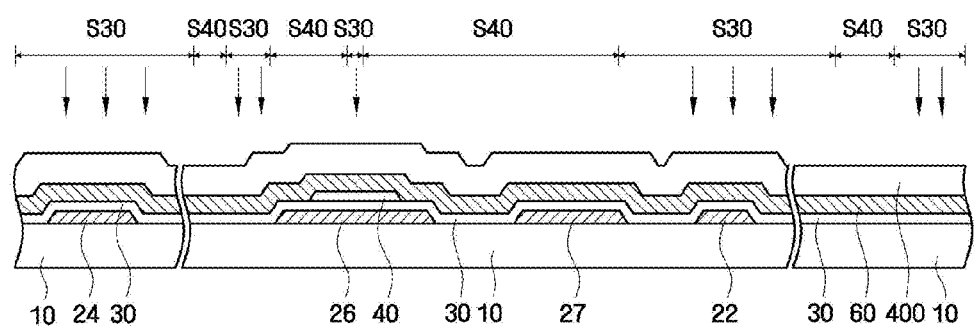

Next, referring to FIG. 11, a data wiring conductive film 60 is formed on the gate insulating film 30 and the semiconductor layer 40. Then, the data wiring conductive film 60 is coated with a photoresist composition including an alkali-soluble resin, a photosensitizer containing a first compound containing a diazonaphthoquinone represented by Formula 1 and a second compound containing a diazonaphthoquinone represented by Formula 2, and a solvent, thereby forming a photoresist film 400. The data wiring conductive film 60 may be coated with the photoresist film 400 by using a spray method, a roll-coating method, or a spin-coating method.

The photoresist composition and a method of forming the photoresist film 400 are substantially similar to the photoresist composition and the method of forming a pattern according to the above-described exemplary embodiments of the present invention so repeated descriptions are omitted.

The substrate 10 having the photoresist film 400 is exposed to light. Here, the exposure heads 130 (see FIG. 1) of the digital exposure apparatus 180 irradiate light, indicated by the vertical arrows in FIG. 11, to regions S30 in which the data wirings are not to be formed is and do not irradiate light to regions S40 in which the data wirings are to be formed.

Figure 12:
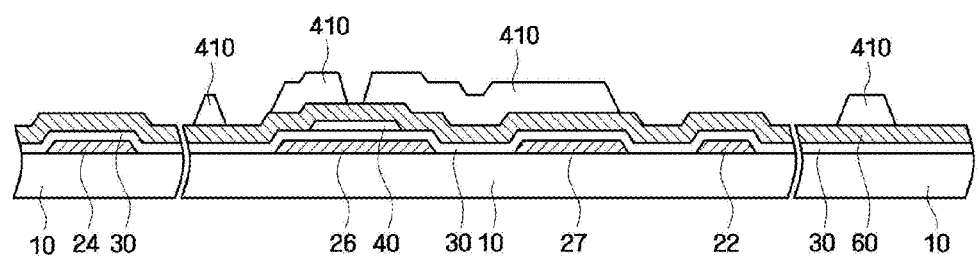

Next, referring to FIG. 12, the regions S30 of the photoresist film 400, which were exposed to light, are removed using a developing solution, thereby forming a photoresist pattern 410.

Figure 13A:
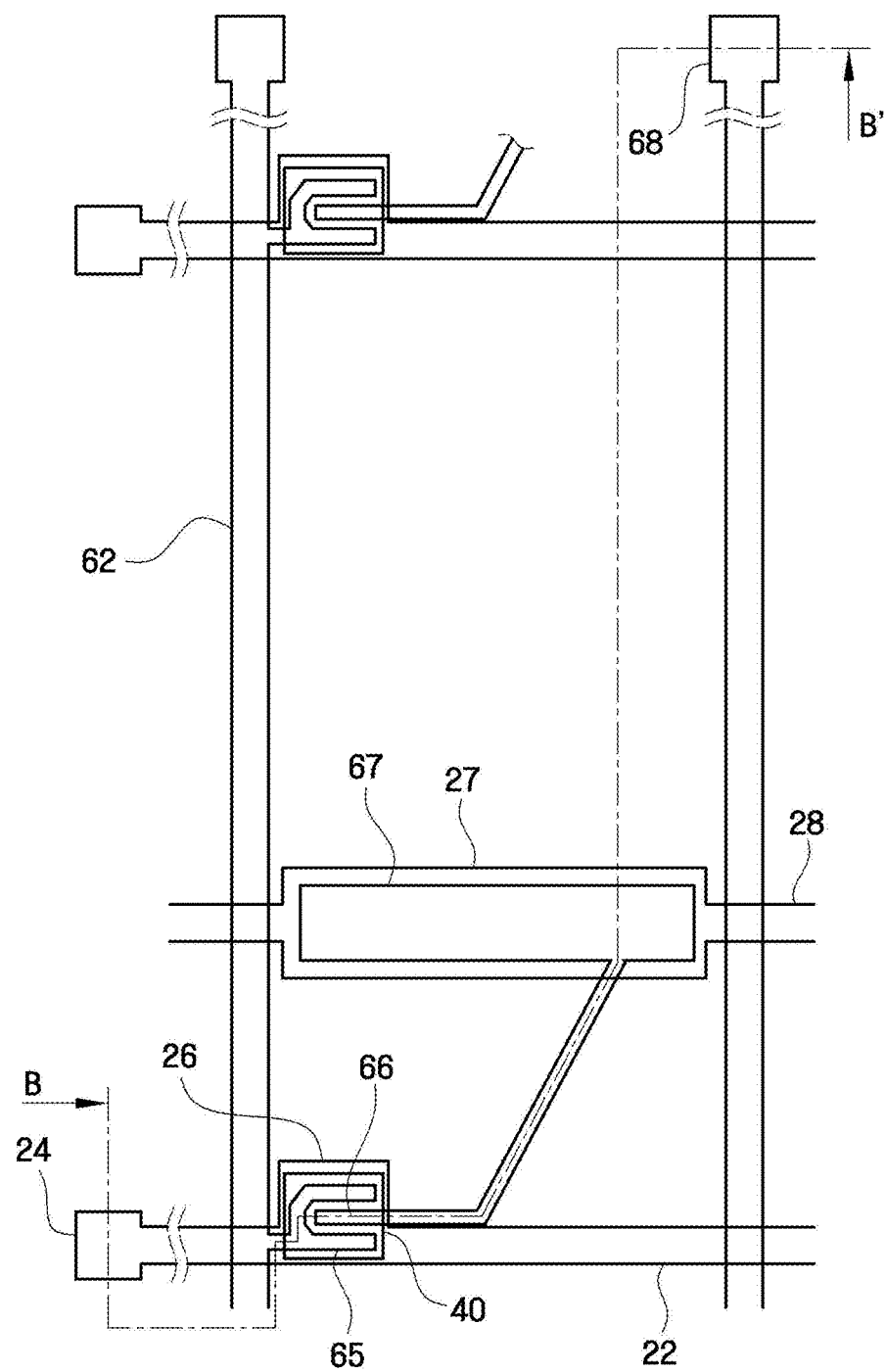
Figure 13B:
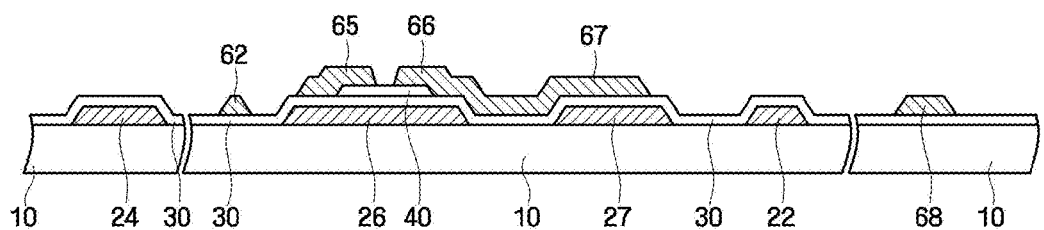

Then, referring to FIG. 13A and FIG. 13B, the data wiring conductive film 60 is etched using the photoresist pattern 410 as a mask, thereby forming the data wiring, i.e., the data line 62, the source electrode 65, the drain electrode 66, the drain electrode extension portion 67, and the data end 68.

Next, referring to FIG. 7 and FIG. 8, the passivation film 70 is formed using, e.g., PECVD or reactive sputtering.

Then, the gate insulating film 30 and the passivation film 70 are patterned using, e.g., a photolithography process, to form the contact holes 74, 77, and 78 that expose the gate end 24, the drain electrode extension portion 67, and the data end 68, respectively.

Thereafter, a transparent conductor film is deposited on the resultant structure, and a photolithography process is performed on the transparent conductor film to form the pixel electrode 82 which is connected to the drain electrode 66 by the contact hole 77 and to form the auxiliary gate end 84 and the auxiliary data end 88 that are connected to the gate end 24 and the data end 68 by the contact holes 74 and 78, respectively.

In the above-described method of manufacturing a TFT substrate according to the current exemplary embodiment, a photoresist pattern formed using a photoresist composition is used to form the data wiring. However, the present invention is not limited thereto, and the photoresist pattern formed using the photoresist composition according exemplary embodiments of the present invention can also used to form other electrode patterns or semiconductor layer patterns of a TFT substrate.

Hereinafter, exemplary embodiments of the present invention are described in Example 1, Example 2, Example 3, Example 4, Example 5 Comparative Example 1, and Comparative Example 2.

Preparation of a Cresol Novolac Resin

A cresol novolac resin having a weight-average molecular weight of 8,000 was obtained by the condensation reaction of a cresol monomer, which contained a 50:50 mixture by weight of m-cresol and p-cresol, with formaldehyde in the presence of oxalic acid as a catalyst.

Preparation of a Photosensitizing Compound

Comparative compound 1 was obtained by the condensation reaction of 2,3,4-trihydroxybenzophenone with a naphthoquinone 1,2-diazide-5-sulfonyl halide compound.

A first compound represented by Formula 1 below was obtained by the condensation reaction of 2,3,4,4'-tetrahydroxybenzophenone with a naphthoquinone 1,2-diazide-5-sulfonyl halide compound.

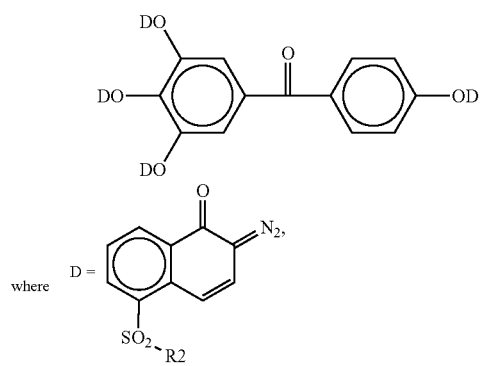

(1)

where D = and R2 is selected from the group consisting of Cl, F, Br, and I.

Furthermore, a second compound represented by Formula 2 below was obtained by the condensation reaction of 4,4', 4"-ethylidynetrisphenol with a naphthoquinone 1,2-diazide-5-sulfonyl halide compound.

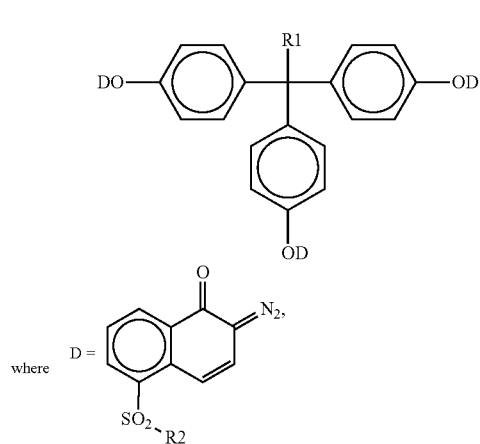

(2)

where D = and R1 is selected from the group consisting of a hydrogen atom, an alkyl group having 1 to 4 carbons, an alkenyl group having 2 to 4 carbons, a cycloalkyl group having 3 to 8 carbons, and an aryl group having 6 to 12 carbons, and R2 is selected from the group consisting of Cl, F, Br, and I.

Preparation of a Photoresist Composition

Comparative Example 1

A photoresist composition was prepared by dissolving a solid, which contains 10 parts by weight of the cresol novolac resin and 5 parts by weight of a photosensitizer of comparative compound 1, in 85 parts by weight of propylene glycol monomethylethyether acetate (PGMEA).

Comparative Example 2

A photoresist composition was prepared by dissolving a solid, which contains 10 parts by weight of the cresol novolac resin and 5 parts by weight of a photosensitizer of the first compound, in 85 parts by weight of PGMEA.

Example 1

A photoresist composition was prepared by dissolving a solid, which contains 10 parts by weight of the cresol novolac resin and 5 parts by weight of a photosensitizer having the first compound and the second compound mixed in a ratio of 1:9, in 85 parts by weight of PGMEA.

Example 2

A photoresist composition was prepared by dissolving a solid, which contains 10 parts by weight of the cresol novolac resin and 5 parts by weight of a photosensitizer having the to first compound and the second compound mixed in a ratio of 2:8, in 85 parts by weight of PGMEA.

Example 3

A photoresist composition was prepared by dissolving a solid, which contains 10 parts by weight of the cresol novolac resin and 5 parts by weight of a photosensitizer having the first compound and the second compound mixed in a ratio of 3:7, in 85 parts by weight of PGMEA.

Example 4

A photoresist composition was prepared by dissolving a solid, which contains 10 parts by weight of the cresol novolac resin and 5 parts by weight of a photosensitizer having the first compound and the second compound mixed in a ratio of 4:6, in 85 parts by weight of PGMEA.

Example 5

A photoresist composition was prepared by dissolving a solid, which contains 10 parts by weight of the cresol novolac resin and 5 parts by weight of a photosensitizer having the first compound and the second compound mixed in a ratio of 5:5, in 85 parts by weight of PGMEA.

Evaluation of Photoresist Patterns

A photoresist pattern was formed using each of the photoresist compositions prepared in Comparative Example 1, Comparative Example 2, Example 1, Example 2, Example 3, Example 4, and Example 5. Specifically, the photoresist compositions of Comparative Example 1, Comparative Example 2, Example 1, Example 2, Example 3, Example 4, and Example 5 were spin-coated on a glass substrate, were exposed to light from an H-line light source for digital exposure, and were developed using a TMAH aqueous solution. Then, the developed photoresist patterns were observed using a scanning electron microscope (SEM).

Figure 14:
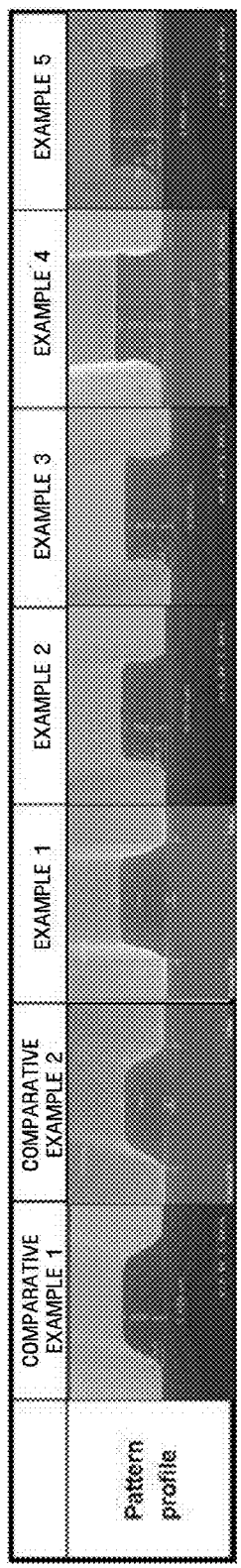
FIG. 14 shows scanning electron micrographs of photoresist patterns formed using photoresist compositions of Example 1, Example 2, Example 3, Example 4, Example 5 Comparative Example 1, and Comparative Example 2.

FIG. 14 shows scanning electron micrographs of photoresist patterns formed using the photoresist compositions of Comparative Example 1, Comparative Example 2, Example 1, Example 2, Example 3, Example 4, and Example 5. Referring to FIG. 14, photoresist patterns formed using the photoresist compositions of Example 1, Example 2, Example 3, Example 4, and Example 5 have better pattern profiles than those formed using the photoresist compositions of Comparative Example 1 and Comparative Example 2.

Of the photoresist patterns formed using the photoresist compositions of Example 1, Example 2, Example 3, Example 4, and Example 5, the photoresist patterns formed using the photoresist compositions of Example 2 and Example 3 have best pattern profiles.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A photoresist composition, comprising:
an alkali-soluble resin;
a photosensitizer comprising a first compound comprising a diazonaphthoquinone represented by Formula 1 and a second compound comprising a diazonaphthoquinone represented by Formula 2; and
a solvent,

wherein,

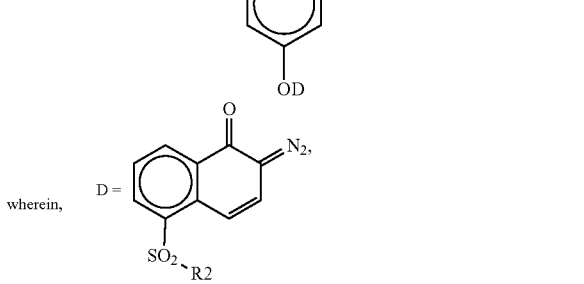

wherein the ratio of the first compound to the second compound ranges from about 1:3 to about 1:7, based on parts per weight of the photoresist composition, and
wherein R1 is selected from the group consisting of a hydrogen atom, an alkyl group having 1 to 4 carbons, an alkenyl group having 2 to 4 carbons, a cycloalkyl group having 3 to 8 carbons, and an aryl group having 6 to 12 carbons, and wherein R2 is a bond to a corresponding oxygen.

2. The photoresist composition of claim 1, wherein the photosensitizer ranges from about 1 part by weight to about 25 parts by weight of the photoresist composition.

3. The photoresist composition of claim 1, wherein the second compound ranges from about 10 parts by weight to about 20 parts by weight of the photoresist composition.

4. The photoresist composition of claim 1, wherein the photosensitizer absorbs H-line light comprising a wavelength of about 405 nm.

5. The photoresist composition of claim 1, further comprising at least one additive selected from the group consisting of a surfactant, an adhesion promoter, a plasticizer, a sensitizer, and a resin.

6. The photoresist composition of claim 1, wherein the photoresist composition is a positive photoresist composition.

7. The photoresist composition of claim 1, wherein the alkali-soluble resin ranges from about 2 parts by weight to about 50 parts by weight of the photoresist composition.

8. The photoresist composition of claim 1, wherein the alkali-soluble resin comprises a weight-average molecular weight ranging from about 2,000 to about 50,000.

9. The photoresist composition of claim 1, wherein the alkali-soluble resin comprises a novolac resin comprising meta-cresol and para-cresol.

10. A method of forming a pattern, the method comprising:
forming a photoresist film by arranging a photoresist composition on a pattern forming film, the photoresist composition comprising an alkali-soluble resin, a photosensitizer comprising a first compound comprising a diazonaphthoquinone represented by Formula 1 and a second compound comprising a diazonaphthoquinone represented by Formula 2, and a solvent;
exposing the photoresist film to light;
forming a photoresist pattern by developing the photoresist film; and
patterning the pattern forming film using the photoresist pattern as an etch mask,

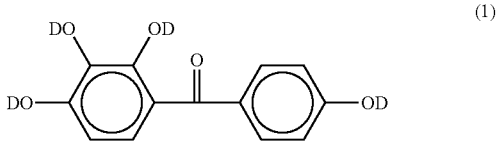

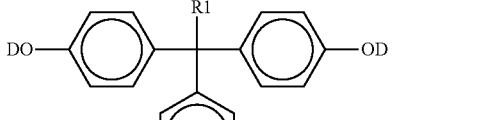

wherein,

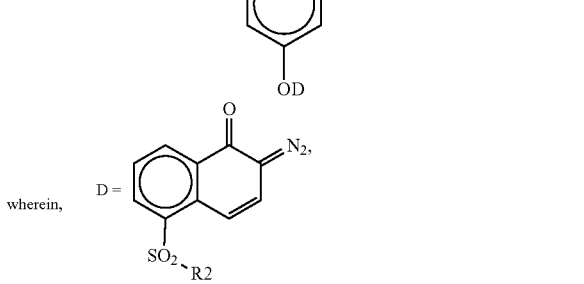

the ratio of the first compound to the second compound ranges from about 1:3 to about 1:7, based on parts per weight of the photoresist composition, and
R1 is selected from the group consisting of a hydrogen atom, an alkyl group having 1 to 4 carbons, an alkenyl group having 2 to 4 carbons, a cycloalkyl group having 3 to 8 carbons, and an aryl group having 6 to 12 carbons, and R2 is selected from the group consisting of Cl, F, Br, and I.

11. The method of claim 10, wherein the photosensitizer ranges from about 1 part by weight to about 25 parts by weight of the photoresist composition.

12. The method of claim 10, wherein the second compound ranges from about 10 parts by weight to about 20 parts by weight of the photoresist composition.

13. The method of claim 10, further comprising performing a condensation reaction of 2,3,4,4'-tetrahydroxybenzophenone with a naphthoquinone 1,2-diazide-5-sulfonyl chloride compound to obtain the first compound.

14. The method of claim 10, further comprising performing a condensation reaction of 4,4',4"-ethylidynetrisphenol with a naphthoquinone 1,2-diazide-5-sulfonyl chloride compound to obtain the second compound.

15. The method of claim 10, wherein in the exposing the photoresist film to light, the light comprises an H-line light comprising a wavelength of about 405 nm.

16. The method of claim 10, wherein the photoresist composition comprises a positive photoresist composition.

17. The method of claim 10, wherein the alkali-soluble resin comprises a novolac resin comprising meta-cresol and para-cresol.

18. The method of claim 10, wherein the alkali-soluble resin ranges from about 2 parts by weight to about 50 parts by weight of the photoresist composition.

\* \* \* \* \*